(12) United States Patent
Nanayakkara

(10) Patent No.: US 8,674,681 B2
(45) Date of Patent: Mar. 18, 2014

(54) VOLTAGE DETECTION AND MEASUREMENT CIRCUIT

(75) Inventor: Ravi Nanayakkara, Racine, WI (US)

(73) Assignee: Rockwell Automation Technologies, Inc., Mayfield Heights, OH (US)

(*) Notice: Subject to any disclaimer, the term of this patent is extended or adjusted under 35 U.S.C. 154(b) by 419 days.

(21) Appl. No.: 12/787,188

(22) Filed: May 25, 2010

(65) Prior Publication Data

US 2011/0291641 A1   Dec. 1, 2011

(51) Int. Cl.
*G01R 1/20* (2006.01)

(52) U.S. Cl.
USPC .......................................................... 324/126

(58) Field of Classification Search
USPC ................ 324/762.01–762.1, 764.01, 126; 327/77, 80, 514, 72, 74; 257/48
See application file for complete search history.

(56) References Cited

U.S. PATENT DOCUMENTS 5,959,448 A * 9/1999 Baranski et al. ................. 324/96
6,229,349 B1 * 5/2001 Franckart et al. ............... 327/77

* cited by examiner

*Primary Examiner* — Tung X Nguyen
(74) *Attorney, Agent, or Firm* — Fletcher Yoder, P.C.; William R. Walbrun; John M. Miller

(57) ABSTRACT

A voltage detection and measurement circuit is provided. The circuit includes a first Zener diode operatively coupled to an AC power input line and a second Zener diode operatively coupled to a reference voltage line. The first and second Zener diodes are configured to pass portions of input AC voltage from the AC power input line to generate output waveforms. The circuit also includes an optocoupler coupled to the first and second Zener diodes to receive the output waveforms from the first and second Zener diodes to detect the input AC voltage and a processing circuit configured to receive the output waveforms from the optocoupler and to determine a magnitude of the input AC voltage based upon the output waveforms.

20 Claims, 4 Drawing Sheets

VOLTAGE DETECTION AND MEASUREMENT CIRCUIT

BACKGROUND

The invention relates generally to control systems and, and particularly to a voltage detection and measurement circuit for such systems.

Wide variety of power sources exists to power electrical devices such as employed in industrial automation and control systems. The electrical devices may be subjected to a plurality of different supply voltage levels from the power source. For example, supply voltages may differ significantly in different geographic areas throughout the world. In addition, voltages can vary from the nominal supply value.

Typically, it is desirable to detect presence of an input voltage while connecting a power source to the electrical devices. Furthermore, it is beneficial to measure the magnitude of the input voltage for configuring the electrical devices.

One way of detecting input voltages is via isolation transformers. However, the isolation transformers may be expensive and may not provide an accurate measurement of magnitude of the input voltage required for control of voltages of the electrical devices.

Accordingly, it would be desirable to develop a voltage detection and measurement system that can automatically detect an input voltage and measure magnitude of such voltages.

BRIEF DESCRIPTION

Briefly, according to one embodiment of the present invention, a voltage detection and measurement circuit is provided. The circuit includes a first Zener diode operatively coupled to an AC power input line and a second Zener diode operatively coupled to a reference voltage line. The first and second Zener diodes are configured to pass portions of input AC voltage from the AC power input line to generate output waveforms. The circuit also includes an optocoupler coupled to the first and second Zener diodes to receive the output waveforms from the first and second Zener diodes to detect the input AC voltage and a processing circuit configured to receive the output waveforms from the optocoupler and to determine a magnitude of the input AC voltage based upon the output waveforms.

In accordance with another aspect, a method is provided for detecting and measuring an input AC voltage. The method includes applying an input AC voltage to a plurality of Zener diodes and passing portions of the input AC voltage exceeding a breakdown voltage of the Zener diodes to provide output waveforms to an optocoupler. The characteristics of the output waveforms depend upon a magnitude of the input voltage. The method also includes processing the output of the optocoupler to detect the input AC voltage and to estimate the magnitude of the input voltage.

In accordance with another aspect, a voltage detection and measurement circuit is provided. The circuit includes an AC power input conductor and first and second Zener diodes coupled to the AC power input conductor and configured to pass portions of input AC voltage from the AC power input conductor to generate output waveforms. The circuit includes an optocoupler coupled to the first and second Zener diodes. The optocoupler is configured to receive the output waveforms from the first and second Zener diodes. The circuit includes a plurality of resistors disposed between the AC power input line and the optocoupler. The resistors are configured to limit current through the optocoupler and the first and second Zener diodes. The circuit further includes a processing circuit configured to process output waveforms from the optocoupler to detect an input voltage signal and/or to distinguish between multiple input voltage waveforms on the input conductor.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As discussed in detail below, embodiments of the present technique function to provide a voltage detection and measurement circuit for measuring input AC voltage applied to components of a system such as control and automation systems. In particular, the present technique utilizes a plurality of Zener diodes and an optocoupler to generate output waveforms having characteristics that are indicative of the magnitude of the input voltage.

References in the specification to "one embodiment", "an embodiment", "an exemplary embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Figure 1:
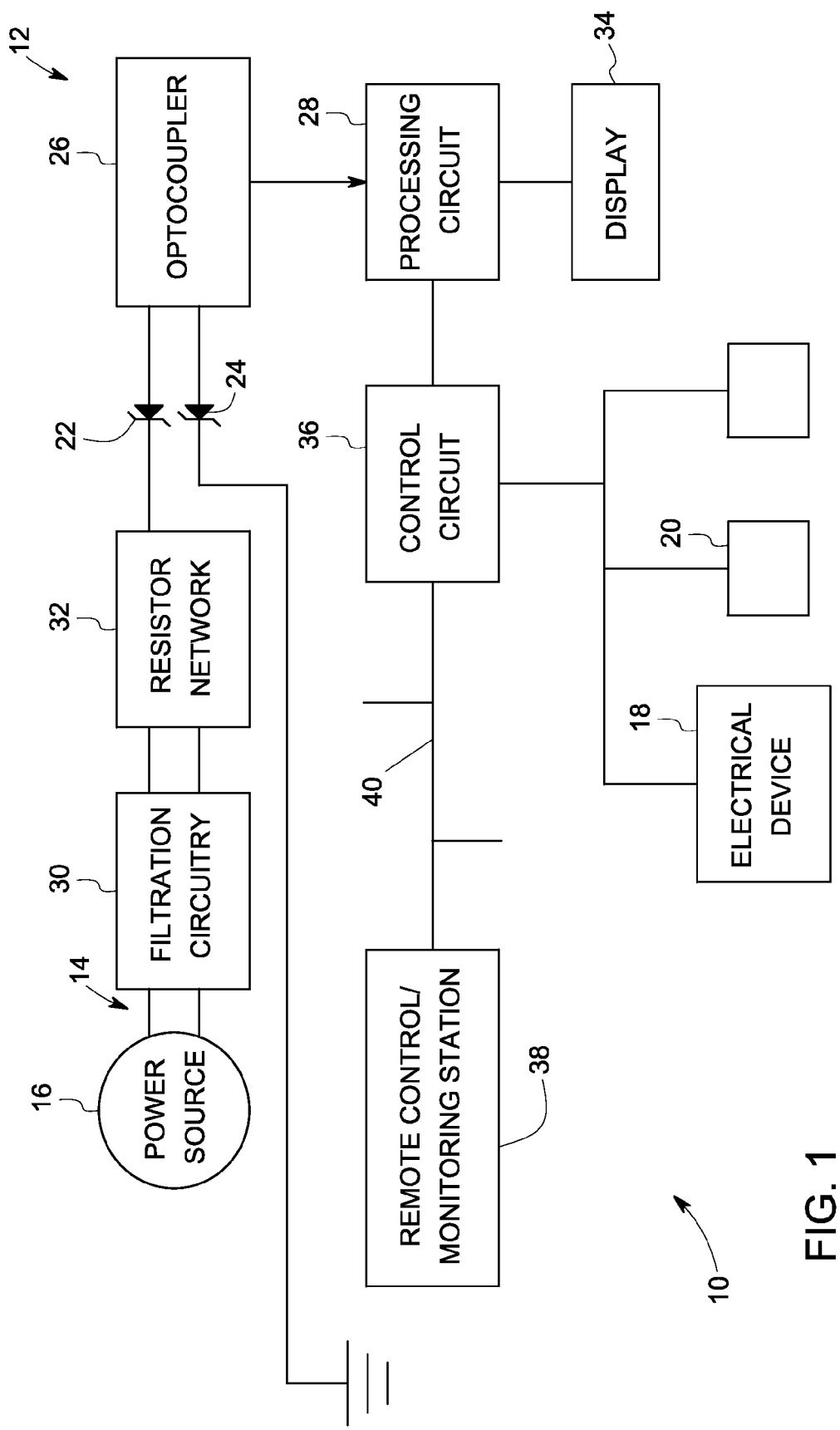
FIG. 1 illustrates a system having a voltage detection and measurement circuit in accordance with aspects of the present invention.

Turning now to drawings and referring first to FIG. 1, a system such as an industrial control system 10 having a voltage detection and measurement circuit 12 is illustrated. In the illustrated embodiment, the system 10 includes an AC power input conductor 14 configured to supply AC voltage from a power supply 16 to downstream electrical devices such as represented by reference numerals 18 and 20. In the illustrated embodiment, the voltage detection and measurement circuit 12 is configured to detect the input voltage signal and to distinguish between multiple input voltage waveforms on the input conductor 14.

In this exemplary embodiment, the circuit 12 includes first and second Zener diodes 22 and 24 operatively coupled to the AC power input conductor 14 and configured to pass portions of input AC voltage from the AC power input conductor 14 to generate output waveforms. In the illustrated embodiment, the first Zener diode 22 is coupled to the AC power input conductor 14 and the second Zener diode 24 is coupled to a reference voltage line, which may be at a ground potential.

Moreover, an optocoupler 26 is coupled to the first and second Zener diodes 22 and 24 and is configured to receive the output waveforms from the first and second Zener diodes 22 and 24. In addition, the circuit 12 includes a processing circuit 28 configured to process output waveforms from the optocoupler 26 to detect the input voltage signal and/or to distinguish between multiple input voltage waveforms on the input conductor 14.

In this exemplary embodiment, the circuit 12 further comprises filtration circuit 30 configured to filter higher order harmonics from the input AC voltage received from the power supply 16. In addition, the circuit includes a resistor network 32 having a plurality of resistors disposed between the power supply 16 and the optocoupler 26. The resistor network 32 is configured to limit current through the optocoupler 26 and the first and second Zener diodes 22 and 24.

In operation, the processing circuit 28 is configured to detect the input voltage signal and to generate sampled output waveforms to estimate the magnitude of the input voltage based upon the sampled output waveforms. In the illustrated embodiment, the estimated magnitude of the input voltage is displayed to a user of the system 10 via a display 34. Further, the system 10 includes a control circuit 36 that receives the estimated magnitude of the input voltage and is configured to control voltage of the electrical devices 18 and 20 based upon such estimated value.

In certain embodiments, the processing circuit 28 is configured to communicate the detection of the input voltage with the estimated value to a remote control and/or monitoring station 38 via a network 40. As will be appreciated by those skilled in the art, the network 40 may include components such as network cables, network interface cards, routers and bridges to communicate with the control circuit 36. The remote control and/or monitoring station 38 may be further configured to remotely control the input voltage of the electrical devices 18 and 20.

Figure 2:
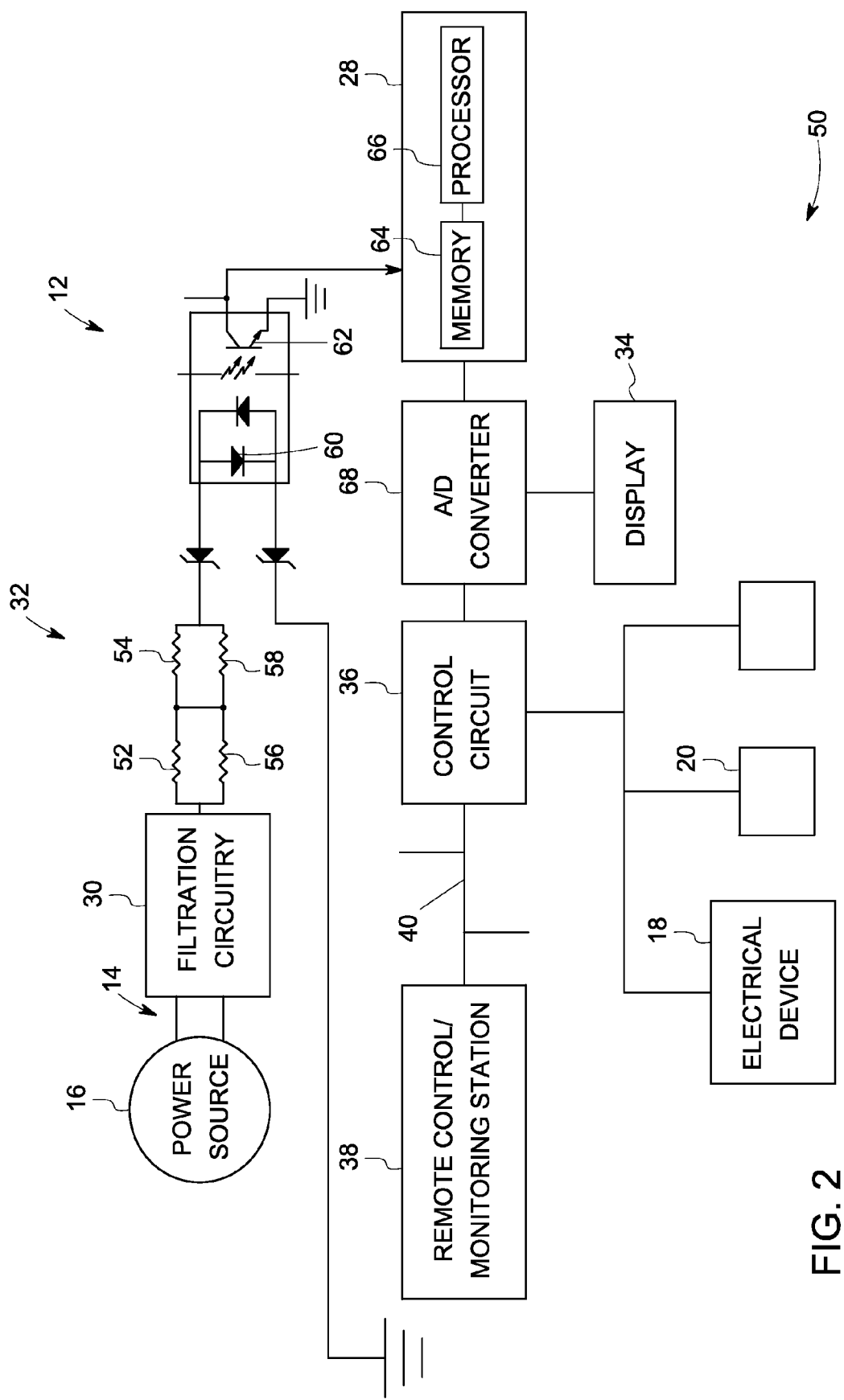
FIG. 2 illustrates exemplary configuration of the system with the voltage detection and measurement circuit of FIG. 1 in accordance with aspects of the present invention.

FIG. 2 illustrates an exemplary configuration 50 of the system 10 with the voltage detection and measurement circuit 12 of FIG. 1. In the illustrated embodiment, the power supply 16 includes a three phase power supply that is configured to output three phase voltages (e.g., from the power grid). In one exemplary embodiment, the power supply 16 is configured to supply a 110 volts input voltage signal. In another exemplary embodiment, the power supply 16 is configured to supply a 220 volts input voltage signal.

In operation, the filtration circuitry 30 filters the higher order harmonics from the input AC voltage received from the power supply 16. In one exemplary embodiment, the filtration circuitry 30 includes an electromagnetic interference and harmonic filter. Further, the resistor network 32 disposed downstream of the filtration circuitry 30 limits current passing through the first and second Zener diodes 22 and 24 and the optocoupler 26.

In this exemplary embodiment, the resistor network 32 includes four resistors represented by reference numerals 52, 54, 56 and 58. However, greater or lesser number of resistors may be employed to limit the current through the first and second Zener diodes 22 and 24. Moreover, the value of the resistance for each of the resistors 52, 54, 56 and 58 may be selected based upon a desired current reduction.

As illustrated, the first Zener diode 22 is coupled to the AC power input conductor 14 and the second Zener diode 24 is coupled to a reference voltage line such as ground potential. The first and second Zener diodes 22 and 24 are configured to pass portions of the input AC voltage that exceed a breakdown voltage of each of the first and second Zener diodes 22 and 24 to generate output waveforms.

In this exemplary embodiment, the breakdown voltage of each of the first and second Zener diodes 22 and 24 is adjusted to distinguish between multiple input voltages. In certain embodiments, the first and second Zener diodes 22 and 24 are further configured to filter voltage noise based upon the breakdown voltage of each of the first and second Zener diodes 22 and 24.

In the illustrated embodiment, the optocoupler 26 is configured to receive the output waveforms from the first and second Zener diodes 22 and 24. In this exemplary embodiment, the optocoupler 26 includes a bi-directional digital optocoupler. The optocoupler 26 includes a light emitting diode such as represented by reference numeral 60 and a photodetector 62 configured to detect the presence of input voltage based upon the output waveforms received from the first and second Zener diodes 22 and 24.

The processing circuit 28 is configured to process the output waveforms from the optocoupler to estimate the magnitude of the detected input voltage. In the illustrated embodiment, the processing circuit 28 includes a memory 64 configured to store the output waveforms from the optocoupler 26. Further, the processing circuit 28 also includes a processor 66 configured to estimate the magnitude of the input voltage.

The memory 64 may include hard disk drives, optical drives, tape drives, random access memory (RAM), read-only memory (ROM), programmable read-only memory (PROM), redundant arrays of independent disks (RAID), flash memory, magneto-optical memory, holographic memory, bubble memory, magnetic drum, memory stick, Mylar® tape, smartdisk, thin film memory, zip drive, and so forth.

It should be noted that the present invention is not limited to any particular processor for performing the processing tasks of the invention. The term "processor," as that term is used herein, is intended to denote any machine capable of performing the calculations, or computations, necessary to perform the tasks of the invention. The term "processor" is intended to denote any machine that is capable of accepting a structured input and of processing the input in accordance with prescribed rules to produce an output.

It should also be noted that the phrase "configured to" as used herein means that the processor is equipped with a combination of hardware and software for performing the tasks of the invention, as will be understood by those skilled in the art.

In one exemplary embodiment, the processor 66 is configured to generate sampled output waveforms and to estimate the magnitude of the input voltage based upon the sampled output waveforms. In this exemplary embodiment, the magnitude of the input voltage is estimated based upon a root mean square value of amplitude of the output waveforms. In one exemplary embodiment, the circuit 12 includes an analog-to-digital converter 68 coupled to the processing circuit 28 to digitize output waveform signals from the optocoupler 26. In certain embodiments, the analog-to-digital converter 68 is integrated within the processing circuit 28 of the circuit 12.

As described before, the estimated magnitude of the input voltage is utilized by the control circuit 36 to configure one or more electrical devices 18 and 20 (e.g., fans) employed in industrial and automation control systems. Advantageously, the detection and measurement of the input voltage facilitates real-time control of the input voltage to such devices 18 and 20.

Figure 3:
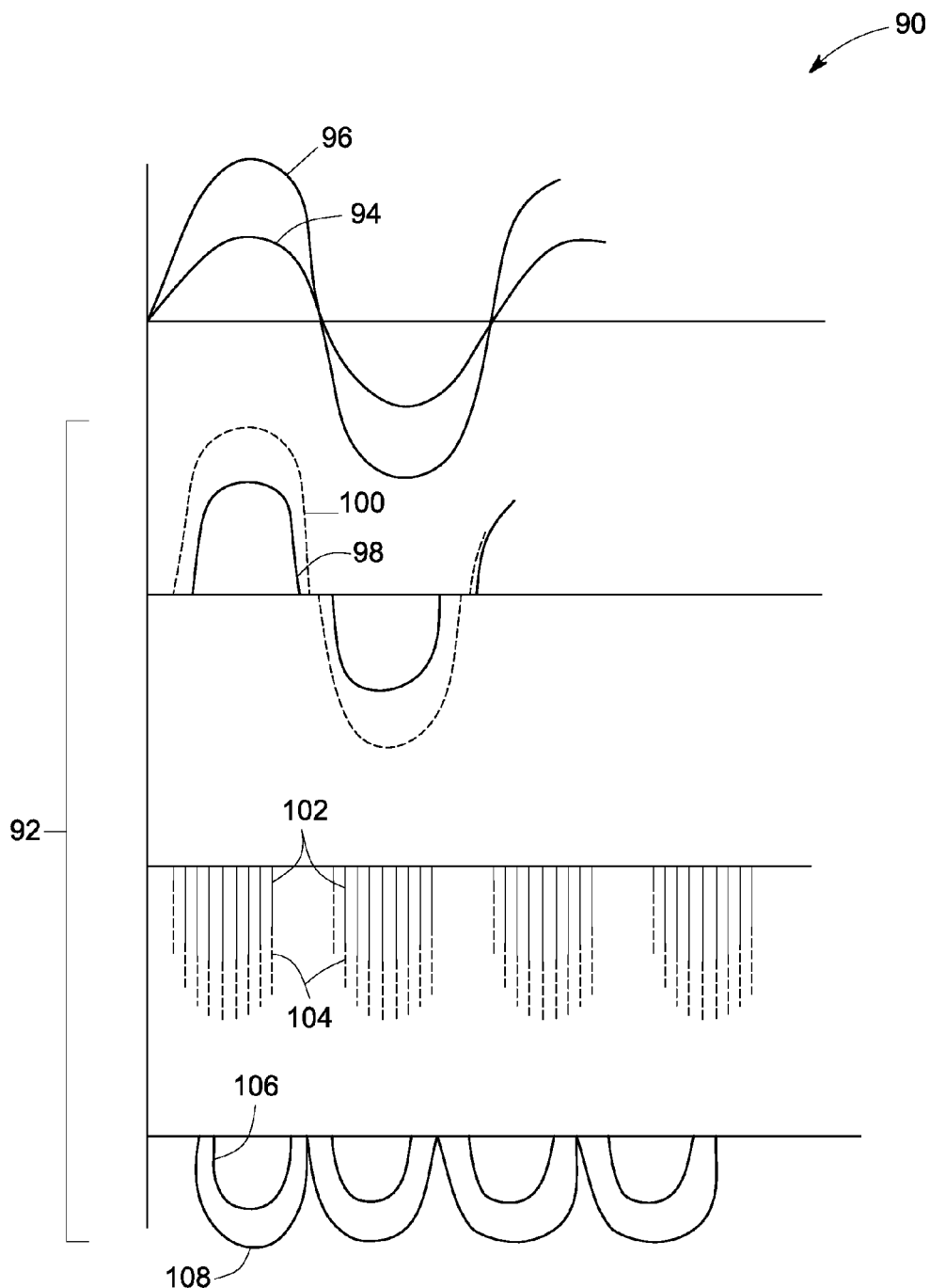
FIG. 3 illustrates exemplary input voltage waveform with corresponding output voltage waveforms generated by the voltage detection and measurement circuit of FIG. 1.

FIG. 3 illustrates exemplary input voltage waveform 90 with corresponding output voltage waveforms 92 generated by the voltage detection and measurement circuit 12 of FIG.

1. In the illustrated embodiment, waveforms corresponding to input voltage signals of 110 volts and 220 volts are represented by reference numerals 94 and 96. Further, corresponding output waveforms from the first and second Zener diodes 22 and 24 supplied to the optocoupler 26 are represented by reference numerals 98 and 100.

As can be seen, the output waveforms 98 and 100 include portions of the input voltage waveforms that have passed through the first and second Zener diodes 22 and 24. In the illustrated embodiment, the breakdown voltages of each of the first and second Zener diodes 22 is selected to distinguish between multiple input voltage waveforms such as the input voltage signals of 110 volts and 220 volts respectively.

In the illustrated embodiment, the sampled output waveforms generated by the processing circuit 28 of FIG. 1 are represented by reference numerals 102 and 104. The sampled waveform corresponding to the input voltage of 110 volts is represented by reference numeral 102. Further, the sampled waveform corresponding to the input voltage of 220 volts is represented by reference numeral 104. The sampled output waveforms 102 and 104 may be rectified using the processing circuit 28 to generate reconstructed waveforms 106 and 108. As can be seen, the characteristics of the output waveforms 106 and 108 are indicative of the magnitude of the input waveforms 94 and 96 thereby facilitating real time detection and measurement of the input voltages.

Figure 4:
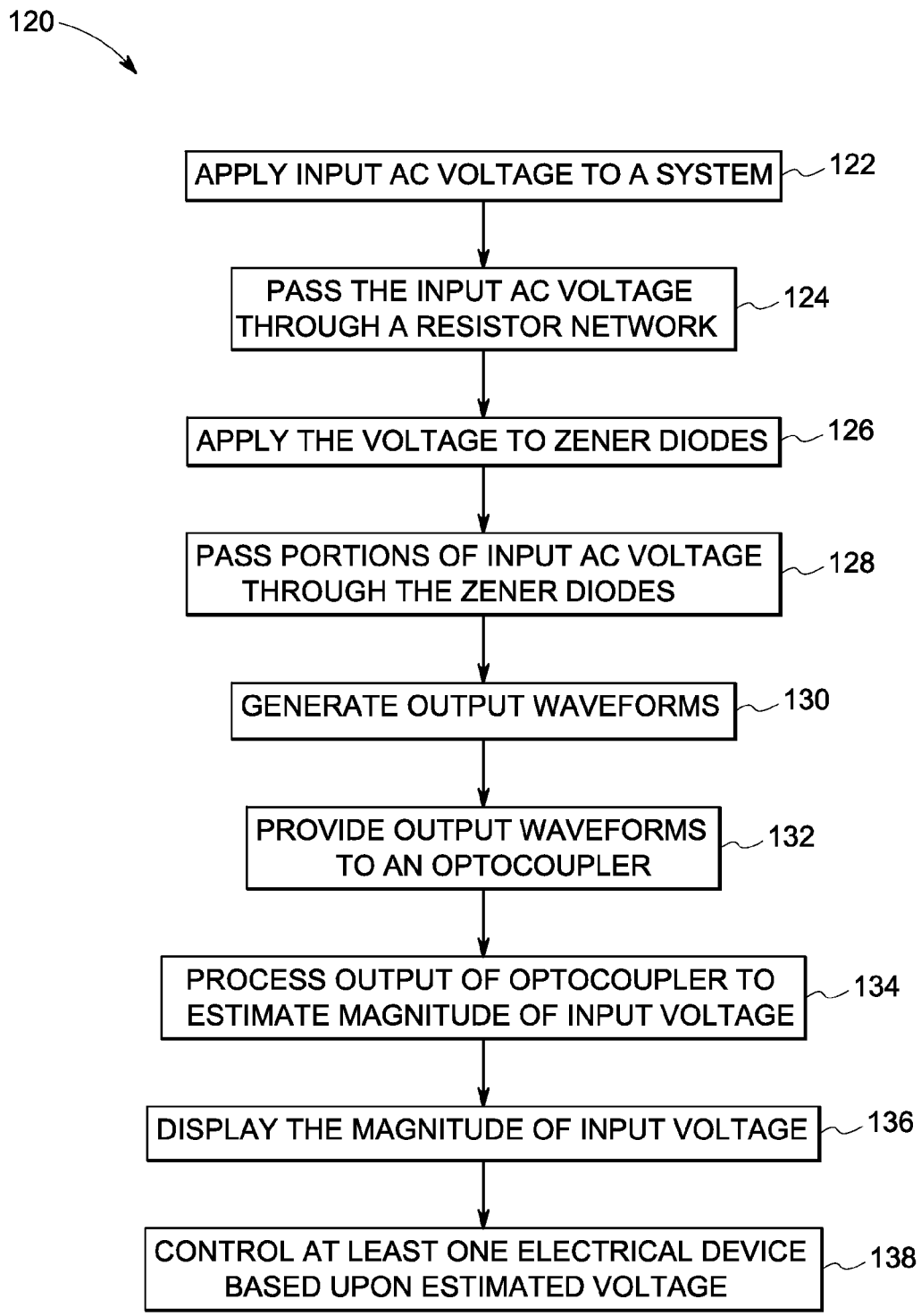
FIG. 4 illustrates an exemplary method for detecting and measuring an input voltage in accordance with aspects of the present invention.

FIG. 4 illustrates an exemplary method 120 for detecting and measuring an input voltage in accordance with aspects of the present invention. At block 122, an input AC voltage is applied to a system. The input AC voltage is then passed through a resistor network to limit current through the downstream components (block 124). At block 126, the input AC voltage is applied to a plurality of Zener diodes of a voltage detection and measurement circuitry (block 124).

A portion of the input AC voltage exceeding the breakdown voltage of the Zener diodes is passed through the Zener diodes to generate output waveforms (blocks 126 and 128). At block 130, the output waveforms are provided to an optocoupler. In this exemplary embodiment, characteristics of the output waveforms depend upon a magnitude of the input voltage.

Further, the output of the optocoupler is processed to detect the input voltage and to estimate the magnitude of the input voltage (block 132). At block 134, the magnitude of the input voltage is displayed to a user of the system. Moreover, voltage of at least one electrical device is controlled based upon the estimated magnitude of the input voltage (block 136).

The various aspects of the structures described hereinabove may be used for detecting and measuring input AC voltage applied to a system. In particular, the technique described above provides an isolated output signal with characteristics indicative of the incoming input AC signal. Advantageously, the use of the Zener diodes for voltage detection and measurement facilitates detection of different voltage levels by adjusting the breakdown value of the Zener diodes while providing low voltage noise rejection.

The technique may be utilized in systems such as industrial control systems for detecting the incoming voltages and automatically configuring the voltages of the components such as fans of such systems thereby eliminating need of manual intervention in configuring such components.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A voltage detection and measurement circuit, comprising:
    a first Zener diode configured to be operatively coupled to an AC power input line;
    a second Zener diode configured to be operatively coupled to a reference voltage line, wherein the first and second Zener diodes are configured to pass portions of input AC voltage from the AC power input line to generate output waveforms;
    a common optocoupler coupled to the first and second Zener diodes to receive the output waveforms from both the first and second Zener diodes to detect the input AC voltage; and
    a processing circuit configured to receive the output waveforms from the optocoupler and to determine presence and/or magnitude of the input AC voltage based upon the output waveforms.

2. The voltage detection and measurement circuit of claim 1, further comprising a resistor network configured to limit current passing through the optocoupler and the first and second Zener diodes.

3. The voltage detection and measurement circuit of claim 1, wherein the reference voltage line comprises a ground potential.

4. The voltage detection and measurement circuit of claim 1, wherein the processing circuit is configured to generate sampled output waveforms and to estimate the magnitude of the input voltage based upon the sampled output waveforms.

5. The voltage detection and measurement circuit of claim 4, wherein the magnitude of the input voltage is estimated based upon a root mean square value of an amplitude of the output waveforms.

6. The voltage detection and measurement circuit of claim 1, wherein the first and second Zener diodes are configured to filter voltage noise based upon a breakdown voltage of each of the first and second Zener diodes.

7. The voltage detection and measurement circuit of claim 1, further comprising a control circuit configured to control voltage of at least one electrical device based upon the magnitude of the input voltage.

8. The voltage detection and measurement circuit of claim 1, further comprising an analog-to-digital converter coupled to the processing circuit and configured to digitize the output waveform signals from the optocoupler.

9. The voltage detection and measurement circuit of claim 1, wherein the optocoupler comprises a light emitting diode and a photodetector configured to detect the presence of the input voltage based upon the output waveforms from the first and second Zener diodes.

10. A method for detecting and measuring an input AC voltage, the method comprising:
    applying an input AC voltage to a plurality of Zener diodes;
    passing portions of the input AC voltage exceeding a breakdown voltage of the Zener diodes to provide output waveforms from each of the plurality of Zener diodes to a common optocoupler, wherein characteristics of the output waveforms depend upon a magnitude of the input voltage; and
    processing the output of the optocoupler to detect the input AC voltage and to estimate the magnitude of the input voltage.

11. The method of claim 10, further comprising adjusting the breakdown voltage of the Zener diodes to distinguish between multiple input AC voltages.

12. The method of claim 10, wherein processing the output waveforms comprises sampling the output waveforms and measuring an amplitude of the sampled waveforms to estimate the magnitude of the input voltage.

13. The method of claim 10, further comprising controlling at least one electrical device based upon the estimated magnitude of the input voltage.

14. A voltage detection and measurement circuit, comprising:
- an AC power input conductor;
- first and second Zener diodes coupled to the AC power input conductor and configured to pass portions of input AC voltage from the AC power input conductor to generate output waveforms;
- a common optocoupler coupled to the first and second Zener diodes, the optocoupler being configured to receive the output waveforms from both the first and second Zener diodes;
- a plurality of resistors disposed between the AC power input line and the optocoupler, the resistors being configured to limit current through the optocoupler and the first and second Zener diodes; and
- a processing circuit configured to process output waveforms from the optocoupler to detect an input voltage signal and/or to distinguish between multiple input voltage waveforms on the input conductor.

15. The voltage detection and measurement circuit of claim 14, wherein multiple input voltages comprise a 110 volts signal or a 220 volts signal.

16. The voltage detection and measurement circuit of claim 14, wherein a breakdown voltage of each of the first and second Zener diodes is adjusted to distinguish between the multiple input voltages.

17. The voltage detection and measurement circuit of claim 16, wherein the first and second Zener diodes are configured to filter low voltage noise based upon the breakdown voltage of each of the first and second Zener diodes.

18. The voltage detection and measurement circuit of claim 14, further comprising a filtration circuitry to filter noise from input AC power.

19. The voltage detection and measurement circuit of claim 14, wherein the optocoupler is configured to generate sampled output waveforms and the processing circuit is configured to estimate the magnitude of the input voltage using the sampled output waveforms.

20. The voltage detection and measurement circuit of claim 14, wherein the optocoupler comprises a bi-directional digital optocoupler.

* * * * *